(12) United States Patent
Dina et al.

(10) Patent No.: US 10,955,444 B2
(45) Date of Patent: Mar. 23, 2021

(54) PEAK DETECTOR

(71) Applicant: TEXAS INSTRUMENTS INCORPORATED, Dallas, TX (US)

(72) Inventors: Marius Vicentiu Dina, Inver Grove Heights, MN (US); Susan Ann Thompson, Half Moon Bay, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/588,678

(22) Filed: Sep. 30, 2019

(65) Prior Publication Data

US 2020/0326358 A1    Oct. 15, 2020

Related U.S. Application Data

(60) Provisional application No. 62/831,223, filed on Apr. 9, 2019.

(51) Int. Cl.
| | | |
|---|---|---|
| *H03K 5/153* | (2006.01) | |
| *G01R 19/04* | (2006.01) | |
| *H03K 5/007* | (2006.01) | |
| *H03M 1/10* | (2006.01) | |
| *H03K 5/1532* | (2006.01) | |

(52) U.S. Cl.
CPC ............ *G01R 19/04* (2013.01); *H03K 5/007* (2013.01); *H03K 5/1532* (2013.01); *H03M 1/1023* (2013.01)

(58) Field of Classification Search
CPC ...... H01S 5/042; H01S 5/0427; H01S 5/0683; G01R 19/04; G01R 19/0038; H03K 5/1532; H03K 5/007; H03K 5/003; G11C 27/00; G11C 27/026; H03F 3/45475; H03F 3/45183; H03M 1/1023
See application file for complete search history.

(56) References Cited

U.S. PATENT DOCUMENTS

| | | | |
|---|---|---|---|
| 7,689,122 B2 | 3/2010 | Moran et al. | |
| 9,665,113 B2 * | 5/2017 | Ciubotaru | G05F 1/575 |
| 2005/0200421 A1 | 9/2005 | Bae et al. | |
| 2006/0120420 A1 * | 6/2006 | Li | H01S 5/0683 |
| | | | 372/38.02 |
| 2012/0106953 A1 | 5/2012 | Nguyen et al. | |

FOREIGN PATENT DOCUMENTS

RU    2100906 C1    12/1997

OTHER PUBLICATIONS

Search Report for PCT/US20/26825, date of mailing of the international search report dated Jun. 11, 2020, 1 page.

* cited by examiner

*Primary Examiner* — Long Nguyen
(74) *Attorney, Agent, or Firm* — Ray A. King; Charles A. Brill; Frank D. Cimino

(57) ABSTRACT

A circuit includes a peak detector, a diode, a dynamic clamp circuit, and an offset correction circuit. The peak detector generates a voltage on the peak detector output proportional to a lowest voltage on the peak defector input. The anode of the diode is coupled to the peak detector input. The dynamic clamp circuit is coupled to the peak detector input and is configured to clamp a voltage on the peak detector input responsive to a voltage on the diode's anode being greater than the lowest voltage on the peak detector's input. The offset correction circuit is coupled to the peak detector output and is configured to generate an output signal whose amplitude is offset from an amplitude of the peak detector output.

14 Claims, 11 Drawing Sheets

PEAK DETECTOR

CROSS-REFERENCE TO RELATED APPLICATION

This application claims priority to, and incorporates by reference, U.S. Provisional Application No. 62/831,223 filed Apr. 9, 2019.

BACKGROUND

Some systems include a laser diode driven by a laser driver integrated circuit (IC). The laser driver IC includes a current source. The laser diode is coupled between a supply voltage and an output terminal of the laser driver IC. When activated, the current source causes current to flow from the supply voltage, through the laser diode, and through the current source to ground. When on, a voltage drop develops across the laser diode, and the voltage on the output terminal of the laser driver IC is equal to the supply voltage less the voltage drop across the laser diode.

A parasitic inductance is typically present between the laser diode and the output terminal of the laser driver IC. The parasitic inductance is a combination of IC bond wire inductance and trace inductance of the printed circuit board on which the laser driver IC is mounted. As such, the current path is from the supply voltage, through the laser diode, through the parasitic capacitance, and through the IC's current source to ground.

The laser diode is pulsed on and off, and during each on-pulse, current from the IC's current source ramps up relatively rapidly. As the current through the parasitic inductance ramps up during each cycle, a voltage develops across the parasitic inductance proportional to the product of the slew rate of the increasing current and the value of the inductance of the parasitic inductance. In addition to the voltage drop across the laser diode, an additional voltage drop due to the parasitic inductance is present between the laser diode and the output terminal of the laser driver IC to which the laser diode is connected. As such, during the time that the current ramps up, the output voltage of the laser diode IC (i.e., the voltage on the output terminal coupled to the laser diode) falls to a level that is equal to the supply voltage less both the laser diode voltage drop and the parasitic inductance voltage. The time duration during which the output voltage drops due to the inductance voltage drop (in addition to the laser diode drop) is relatively short, but the current source within the laser driver IC unfortunately could be saturated during that time. The result of such saturation could be detrimental to the system performance.

SUMMARY

In one example, a circuit includes a peak detector, a diode, a dynamic clamp circuit, and an offset correction circuit. The peak detector generates a voltage on the peak detector output proportional to a lowest voltage on the peak defector input. The anode of the diode is coupled to the peak detector input. The dynamic clamp circuit is coupled to the peak detector input and is configured to clamp a voltage on the peak detector input responsive to a voltage on the diode's anode being greater than the lowest voltage on the peak detector's input. The offset correction circuit is coupled to the peak detector output and is configured to generate an output signal whose amplitude is offset from an amplitude of the peak detector output.

BRIEF DESCRIPTION OF THE DRAWINGS

For a detailed description of various examples, reference will now be made to the accompanying drawings in which.

DETAILED DESCRIPTION

Figure 1:
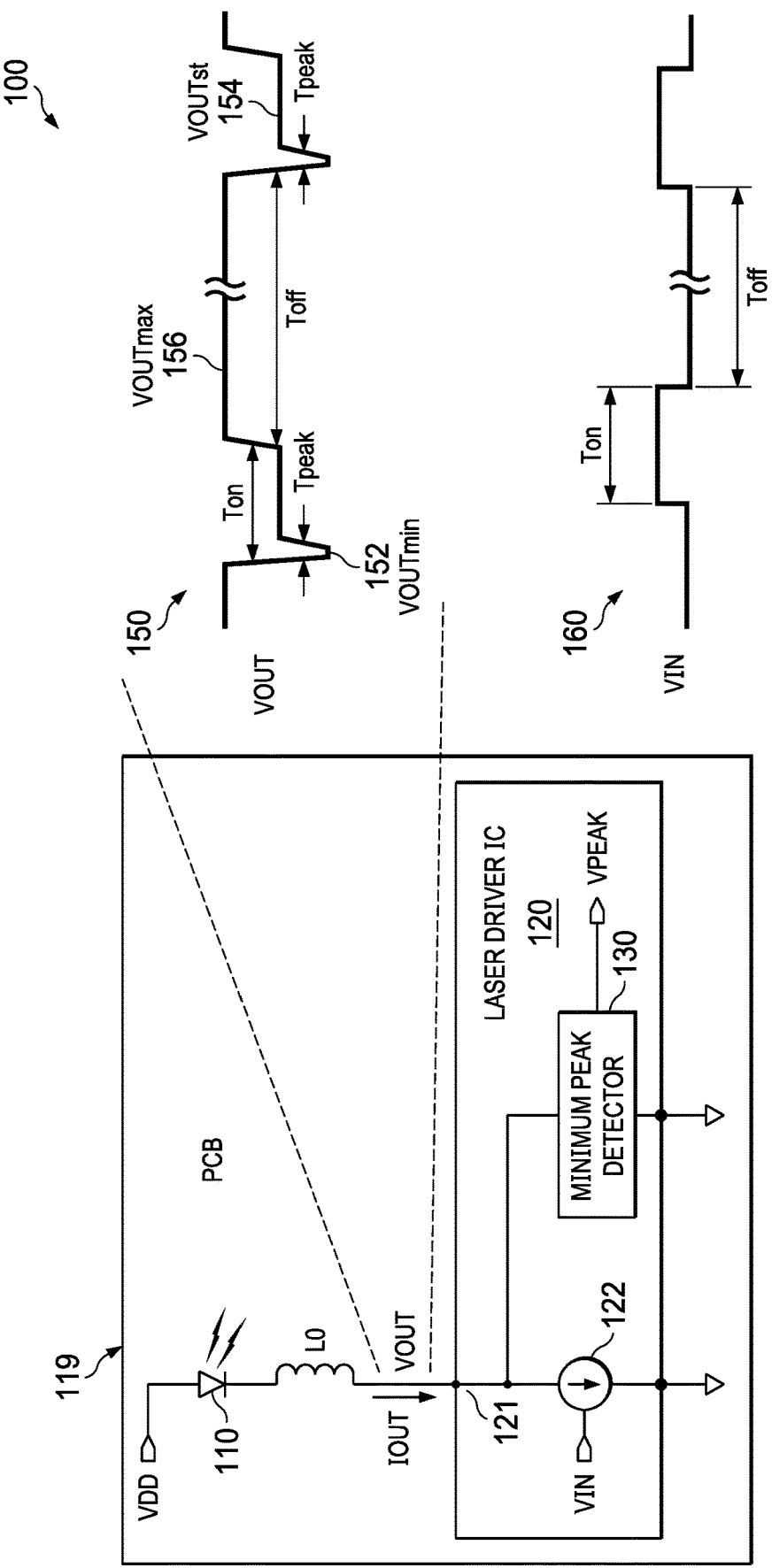
FIG. 1 illustrates a system comprising a laser driver integrated circuit (IC) driving a laser diode, in which the laser driver IC includes a minimum peak detector.

FIG. 1 shows a system 100 in which a laser driver integrated circuit (IC) 120 is connected to an external laser diode 110. The laser driver IC 120 and the laser diode 110 are mounted on a printed circuit board (PCB) 119. While the example of FIG. 1 includes a laser diode, other examples include light sources other than laser diodes. In the example implementation of FIG. 1, an anode of laser diode 110 is connected to a positive power supply node (VDD). Briefly ignoring the inductance L0, the cathode of laser diode 110 is coupled to an output node (also referred to as a terminal or pin) 121 of the laser driver IC 120. The voltage on the output node 121 is labeled VOUT. The laser driver IC 120 includes a current source 122 and a minimum peak detector circuit 130, and possibly other components. An input signal (VIN) is provided to the current source 122 to cause the current source 122 to produce current. In one example, VIN comprises a control signal to turn on and off the current source 122. When the current source 122 is activated, IOUT current flows from VDD through the laser diode 110 and the current source 122 to ground.

Inductance L0 is shown between the laser driver IC 120 output node 121 and the laser diode 110. As explained above, inductance L0 represents the parasitic inductance that is a combination of bond wire inductance (e.g., bond wire between the output node 121 and PCB 119 on which the laser diode IC 120 is mounted) and PCB trace inductance. When the current source 122 is activated, the current IOUT of the laser driver IC 120 ramps from its 0 amperes towards its steady state level during a period of time (e.g., 230 ps). During the IOUT rise time, a voltage develops across the inductance L0 that is equal to $L0*d(IOUT)/dt$, where L0 is the inductance value of inductance L0 and $d(IOUT)/dt$ is the time derivative of IOUT. With IOUT increasing, the voltage on the laser driver's output node 121 (VOUT) is thus VDD minus both the voltage drop across laser diode 110 as well as the voltage developed across the inductance L0. The waveform 150 in FIG. 1 shows the time progression of VOUT. VOUT falls to a minimum level (VOUTmin) at 152 due to the voltages across the laser diode 110 and inductance L0. Tpeak is the amount of time that IOUT is increasing and thus the amount of time during which the voltage develops across the inductance L0. After IOUT reaches its steady state level and thus ceases changing over time, the voltage drop across the inductance L0 becomes 0 V, and VOUT increases to its steady state level (VOUTst) 154, which is VDD less the voltage drop across the laser diode 110.

The laser diode 110 is turned on by the laser driver IC 120 for a period of time (Ton), and then turned for a period of time, Toff. During Toff and thus with no IOUT current flowing, VOUT is equal to VOUTmax (156). VOUTmax 156 is approximately equal to VDD. The laser driver IC 120 repeatedly pulses the laser diode 110 on and off, with a predetermined periodicity. Waveform 160 shows VIN as being a periodic waveform that is high during Ton, and then low during Toff. When VIN is high, the current source 122 is activated to source current through the laser diode 110, and when VIN is low, the laser diode is turned off.

VOUTmin (the minimum voltage of VOUT that occurs as IOUT is ramping up to turn on the laser diode 110) can be low enough to saturate the current source 122. Saturation of the current source 122 could be detrimental to the system performance such as to cause a latch-up problem with a bipolar junction transistor within the current source 122, cause a relatively large amount of current to flow from a power supply to the current source 122, cause the turn-off time for the current source 122 to increase, etc. The minimum peak detector circuit 130 monitors the voltage VOUT on the output node 121 and, in response, generates an output signal VPEAK at a voltage level equal to VOUTmin. That is, while VOUT is only briefly at VOUTmin during each cycle of the laser diode 110, VPEAK persists (following a short settling time) at a relatively constant voltage level (equal to VOUTmin). Thus, VPEAK indicates the lowest level to which VOUT drops during the portion Tpeak of each cycle. The minimum peak detector circuit 130 allows the system to adjust the laser diode supply voltage (VDD) and/or the magnitude of IOUT current in order to prevent saturation of the current source 122.

Figure 2:
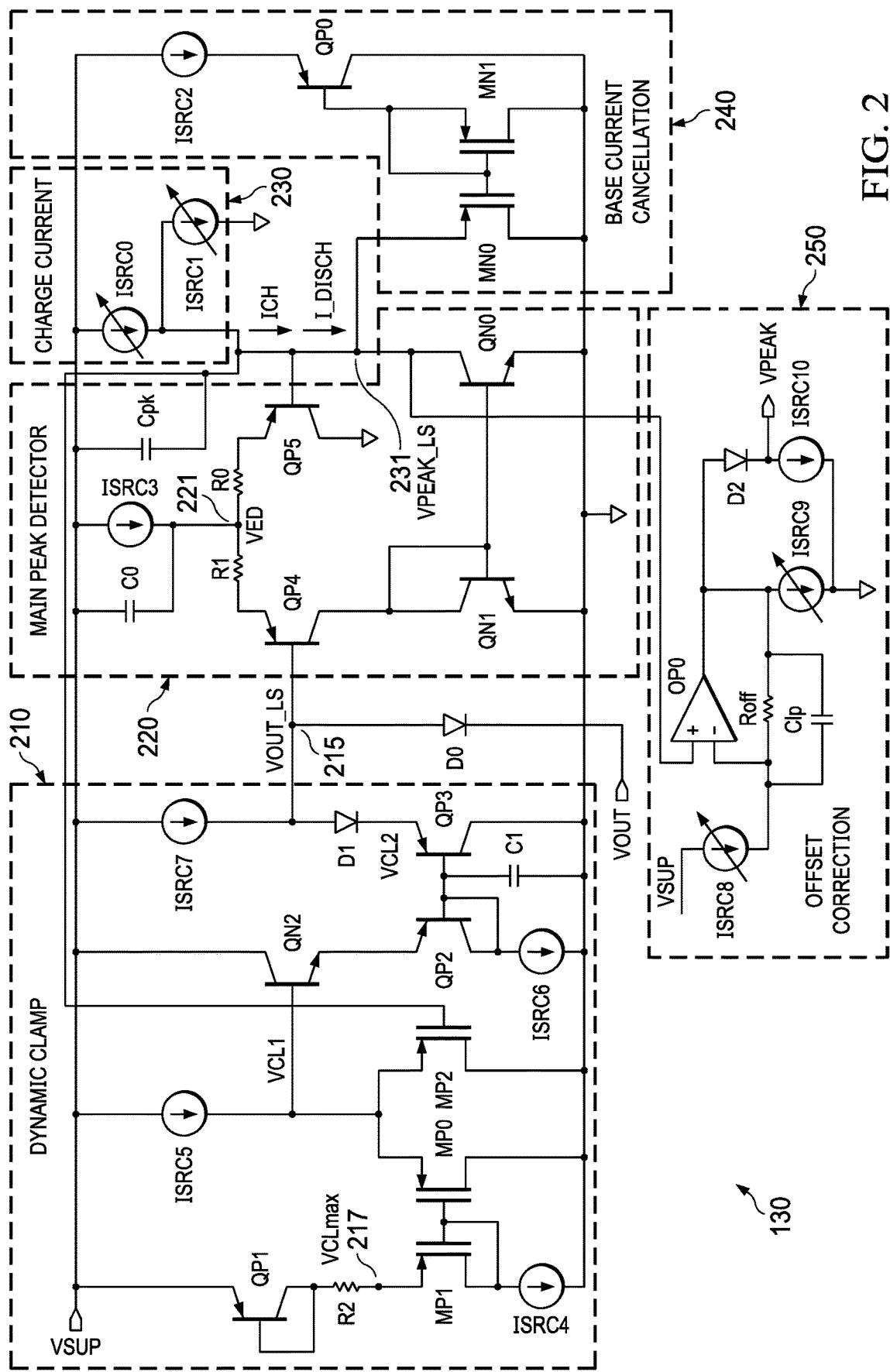
FIG. 2 shows an example implementation of the minimum peak detector of FIG. 1.

FIG. 2 shows an example implementation of the minimum peak detector circuit 130. In this example, the minimum peak detector circuit 130 includes a dynamic clamp circuit 210, a main peak detector circuit 220, a charge current circuit 230, a base current cancellation circuit 240, an offset correction circuit 250, and a blocking diode D0. Other components may be included as well. The cathode of diode D0 is coupled to the output node 121 and thus receives VOUT. The main peak detector circuit 220 generates a signal shown as VPEAK_LS which is a voltage on node 213 that is proportional to VOUTmin but is offset above VOUTmin by the voltage drop across diode D0 as well as well as another voltage offset described below. The offset correction circuit 250 corrects for these offsets and produces the resulting VPEAK signal.

The example circuit implementation of FIG. 2 shows multiple transistors of various types—npn bipolar junction transistors (BJTs), pnp BJTs, n-type metal oxide semiconductor field effect transistors (NMOS), and p-type metal oxide semiconductor field effect transistors (PMOS). Other implementations may include different circuit architectures, and a different type of transistor for one or more of the transistors shown in FIG. 2.

The dynamic clamp circuit 210 includes current source devices ISRC4, ISRC5, ISRC6, and ISRC7, resistor R2, capacitor C1, diode D1, pnp transistors QP1, QP2, and QP3, npn transistor QN2, and PMOS transistors MP0, MP1, and MP2. A voltage supply (VSUP) is provided to the emitter of QP1, the collector of QN2, and to ISRC5 and ISRC7. The collector of QP1 is connected to its base and to R2. The other terminal of R2 is connected to the source of MP1 at a node 217 whose voltage is designated VCLmax. The gates of MP0 and MP1 are connected together and to the drain of MP1. ISRC4 connects between the drain of MP1 and ground.

The base of QN2 is connected to the sources of MP0 and MP2 and to ISRC5 at a node whose voltage is designated VCL1. The emitters of QN2 and QP2 are connected together. The bases of QP2 and QP3 are connected together and to the collector of QP2, to ISRC6, and to C1. ISRC6, C1, and the collector of QP3 connect to ground. The anode of D1 connects to ISRC7, and the cathode of D1 connects to the emitter of QP3. The anode of D1 also connects to D0 at node 215 whose voltage is VOUT_LS.

The main peak detector circuit 220 includes pnp transistors QP4 and QP5, npn transistors QN1, QN0, resistors R0 and R1. The base of QP4 connects to node 215 and thus to the anodes of diodes D0 and D1. The collector of QP4 is connected to the collector and base of QN1. The emitter of QN1 is connected to ground, as is the emitter of QN0. The bases of QN1 and QN0 are connected together. Resistors R0 and R1 are connected together and to C0 and ISRC3 at node 221, whose voltage is designated VED. R1 is connected to the emitter of QP4. R0 is connected to the emitter of QP5. The collector of QP5 is connected to ground. VSUP is provided to C0, ISRC3, and Cpk as shown.

The charge current circuit 230 comprises current sources ISRC0 and ISRC1. Current from ISRC0 is designated ICH_0TC. The ISRC1 current source is a proportional to absolute temperature (PTAT) current source device in that its current varies proportional to temperature (the current increases as temperature rises, and the current decreases as the temperature falls). ISRC0 and ISRC 1 are connected together as shown. Some of the ICH_0TC current from ISRC0 is provided through ISRC1 as ICH_PTAT (proportional to absolute temperature). The rest of the ICH_0TC (ICH_0TC−ICH_PTAT) is shown as ICH. The effect of temperature on the minimum peak detector 130 is described below.

The current sources ISRC0 and ISRC1 are connected to the collector of QN0 at node 231 whose voltage is designated VPEAK_LS. Node 231 (VPEAK_LS) is connected to the base current cancellation circuit 240. The base current cancellation circuit 240 in this example includes current source ISRC2, NMOS transistors MN0 and MN1 and pnp transistor QP0. MN0 and MN1 are configured as a current source and connect to the base of QP0. The emitter of QP0 is connected to a current source ISRC2.

Node 231 (VPEAK_LS) also is coupled to the offset correction circuit 250. The offset correction circuit 250 includes an operational amplifier (OP0), diode D2, current sources ISRC8, ISRC9, and ISRC10, capacitor Clp, and resistor Roff. The output of OP0 is connected to the anode D2. The cathode of D2 provides the output signal VPEAK, and also connects to ISRC10. Roff comprises a feedback resistor connected between the output of OP0 and the negative input of OP0. Capacitor Clp is connected in parallel with Roff. VPEAK_LS is provided to the positive input of OP0. ISRC9 is connected to Roff, Clp, and to the negative input of OP0.

The minimum peak detector circuit 130 detects the minimum or negative peaks in VOUT during each cycle. The term "negative peak" refers to the lowest voltage level of VOUT during each cycle (VOUTmin). VOUTmin, however, is not a negative voltage with respect to ground. The minimum peak detector circuit 130 addresses several design drivers. For example, VOUT may experience a large swing (due to the voltage that develops across the parasitic capacitance L0) as IOUT ramps up when turning on the laser diode 110. For example, VOUT may swing from 10V or higher down to close to ground (e.g., 500 mV) over 230 ps. Further, there could be a large delta (e.g., more than 7V) between VOUTmin and VOUTst due to either a fast rise time of IOUT and/or a large total inductance L0. The minimum peak detector circuit 130 should accurately generate VPEAK for an input pulse at VIN (Ton) of a few nanoseconds or less and the pulse width of the negative peak (Tpeak) on the order of hundreds of picoseconds. These latter timing values generally require transistors made according to a high-speed process which is typically synonymous with lower breakdown voltages for the active devices. The minimum peak detector circuit 130 also should operate with a range of Toff from 20 ns to 200 ns. Further, the detection by the minimum peak detector circuit 130 should have a low temperature variation assuming no difference in the system response as the temperature varies. The minimum VOUT peaks to be detected may be in the range of 300 mV to 2.3 V with a maximum supply available of 4.8V. Further still, the total current consumption should be less than 500 uA. The disclosed minimum peak detector circuit 130 satisfies one or more of these design criteria.

Figure 4:
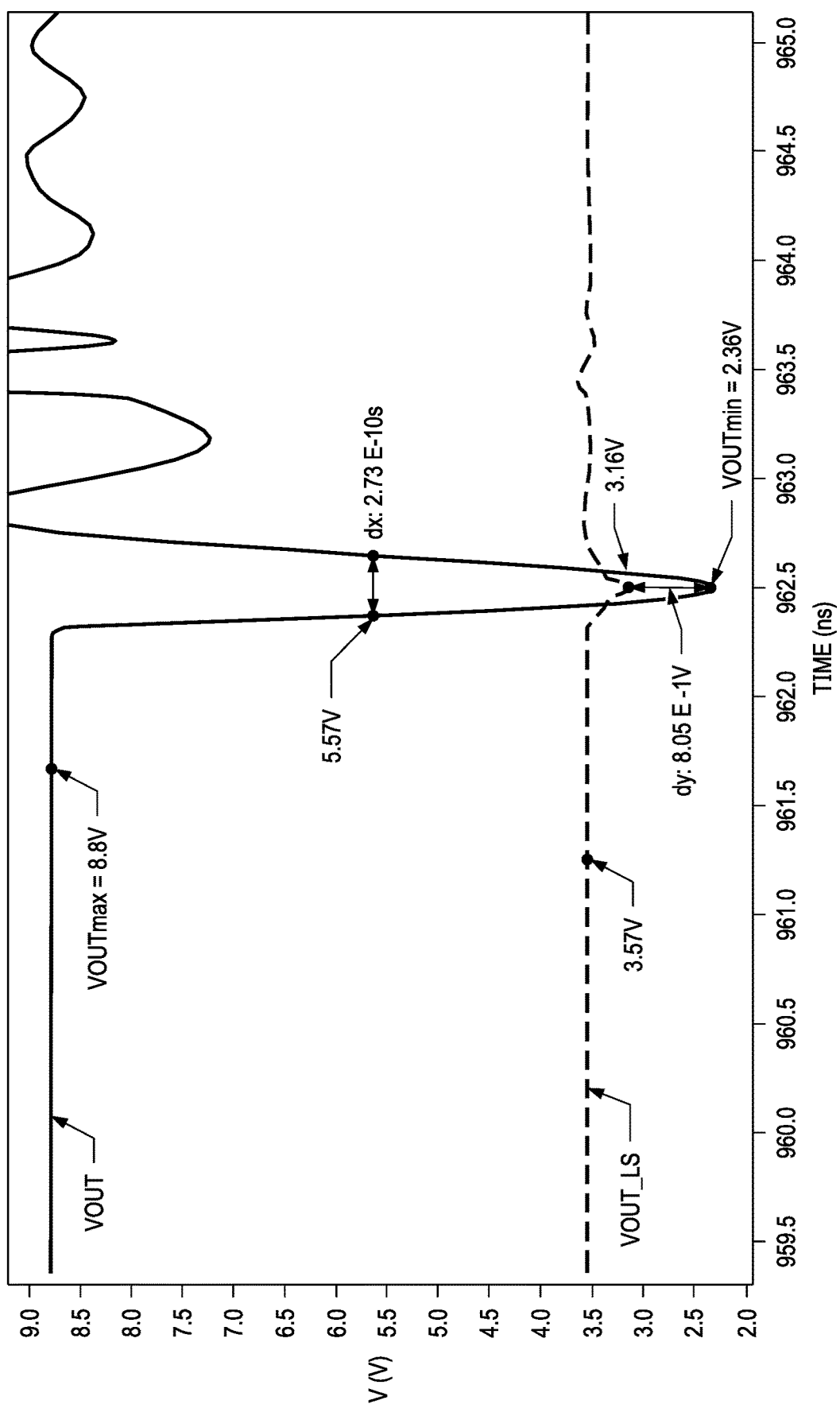
FIG. 4 illustrates another example of the waveforms of the voltages within the minimum peak detector.

The voltage on the anode of diode D0 is VOUT_LS. Given the large voltage swing at VOUT (e.g., 6.5 V and possibly greater), diode D0 functions as a blocking diode to allow only VOUT voltages one diode voltage drop lower than VOUT_LS during every negative transition of VOUT. The dynamic clamp circuit 210 limits the upper limit of VOUT_LS to a predetermined level (e.g., 2.88 V), while the minimum voltage on VOUT_LS is approximately 0.85V (one diode voltage drop) above VOUTmin. For example, in an example in which VOUTmin is 0.56V, VOUT_LS will be 1.41 V (0.56 V+0.85 V). As will be explained below, the voltage VCLmax on node 217 of the dynamic clamp circuit 210 represents the maximum voltage for VOUT_LS. FIG. 4 (further described below) illustrates a case in which VOUT ranges from 8.8V down to 2.36V, and thus VOUT min is 2.36V. In this case the maximum voltage at VOUT_LS equals 3.57V which is the same voltage as VCLmax on node 217. VCLmax thus sets (clamps) the maximum voltage for VOUT_LS.

The following discussion includes the operation of the example dynamic clamp circuit 210 of FIG. 2. Reference is also mode to the waveforms of FIG. 3 which show VOUT and VOUT_LS during a portion of a cycle in which the laser diode 110 is turned on. When the laser diode 110 is off (as is the case at 302) and before any negative peak occurs on VOUT, the following operating condition is present in the dynamic clamp circuit 210. The voltage VOUT at 302 equals VOUTmax which in the case of FIG. 3 equals 7V. The voltage VOUT_LS when the laser diode 110 is off (312) equals VCLmax and is dictated by the voltage drop across the loop formed by transistors MP1, MP0, QN2, QP2, and QP3, and diode D1. In this example, the loop formed by transistors MP1, MP0, QN2, QP2, and QP3, and diode D1 limits the high voltage for VOUT_LS to 2.88 V.

Current source ISRC7 sinks current through D1 and QP3 to ground. For the example in which VSUP is 4.8V, VOUT_LS equals 3.57V at a temperature of 27 degrees Celsius. If VOUT equals 7V, diode D0 is reverse biased by 7 V minus 3.57 V which equals 3.43V. In this implementation, diodes D0 and D1 are implemented as a base-collector junction of an NPN transistor (e.g., an NPN transistor whose base is connected to its collector), which has a reverse bias breakdown voltage larger than, for example, 10V. By solving Kirchoff's Voltage Law (KVL), it can be shown that the main peak detector circuit 220 will set the voltage VPEAK_LS on node 231 as follows: VPEAK_LS=VOUT_LS−VT*In[(Ibs0−ICH)/ICH], where ICH=ISRC0−ISRC1 (described below), Ibs0 is the current value of ISRC3, Ibs0 is substantially greater than ICH, and VT=KT/q, T is the temperature of a p-n junction, K is Boltzmann's constant and q is the magnitude of the charge of an electron.

In one example, at 27 degrees Celsius, Ibs0 is approximately equal to 100*ICH, and VPEAK_LS=VOUT_LS−0.12V which equals 3.57 V−0.12 V=3.45 V. Transistor MP2 is off because the voltage (VCL1) on its source is at the same voltage as VCLmax, which in one example equals 3.57 V, and the gate voltage of MP2 is the VPEAK_LS, which is 3.45 V. As such, the gate-to-source voltage of MP2 is lower than its threshold voltage, and thus MP2 is off.

The collector current of QP4 is equal to the collector current of QN1. QN1 and QN0 form a current mirror. In one example, the current mirror ratio of the current mirror QN1/QN0 is 1:1 and the collector current through QN0 also is equal to the collector current of QP4 and QN1. The charge current ICH flow through QN0, and thus the collector current of QN0, QN1, and QP4 is equal to ICH. At node 221, the current Ibs0 from ISRC3 divides between the branch comprising R1 and QP4 and the branch comprising R0 and QP5. Some of the Ibs0 current thus flows through R1/QP4, and the rest of the current flows through R0/QP5. The collector current of QP5 is equal to Ibs0 minus ICH. The magnitude of Ibs0 is much greater than ICH which means that most of the current of ISRC3 flows through QP5, and only ICH flows through QP4. The base current of QP5 is provided via the base current cancelation circuit 240.

Figure 3:
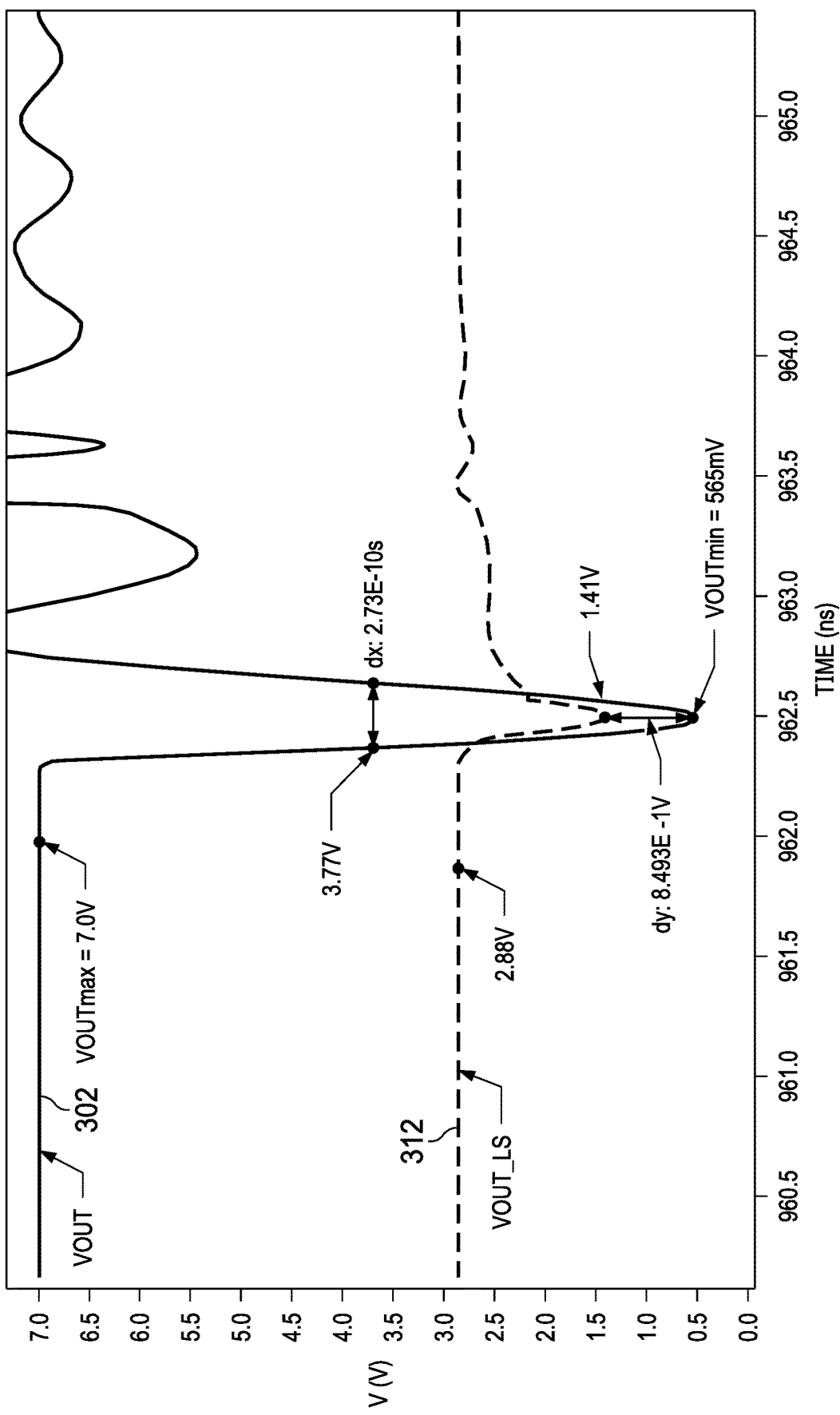
FIG. 3 illustrates example waveforms of voltages within the minimum peak detector.

FIGS. 3 and 4 shows examples in which VOUTmax is 7 V (FIG. 3) and 8.8 V (FIG. 4). In FIG. 3, VOUT falls to 565 mV for VOUTmin, while in FIG. 4, VOUT falls to 2.36 V for VOUTmin. VOUT_LS also tracks downward as VOUT falls to its minimum value but remains about one diode voltage drop above VOUTmin due to the voltage drop across D0. In FIG. 3, the minimum value of VOUT_LS is 1.41 V, while in FIG. 4, the minimum value of VOUT_LS is 3.16 V. The main peak detector circuit 220 generates VPEAK_LS as an indication of the negative peak of VOUT, and the offset correction circuit 250 (described below) corrects the offset between VPEAK_LS and VOUTmin.

Figure 5:
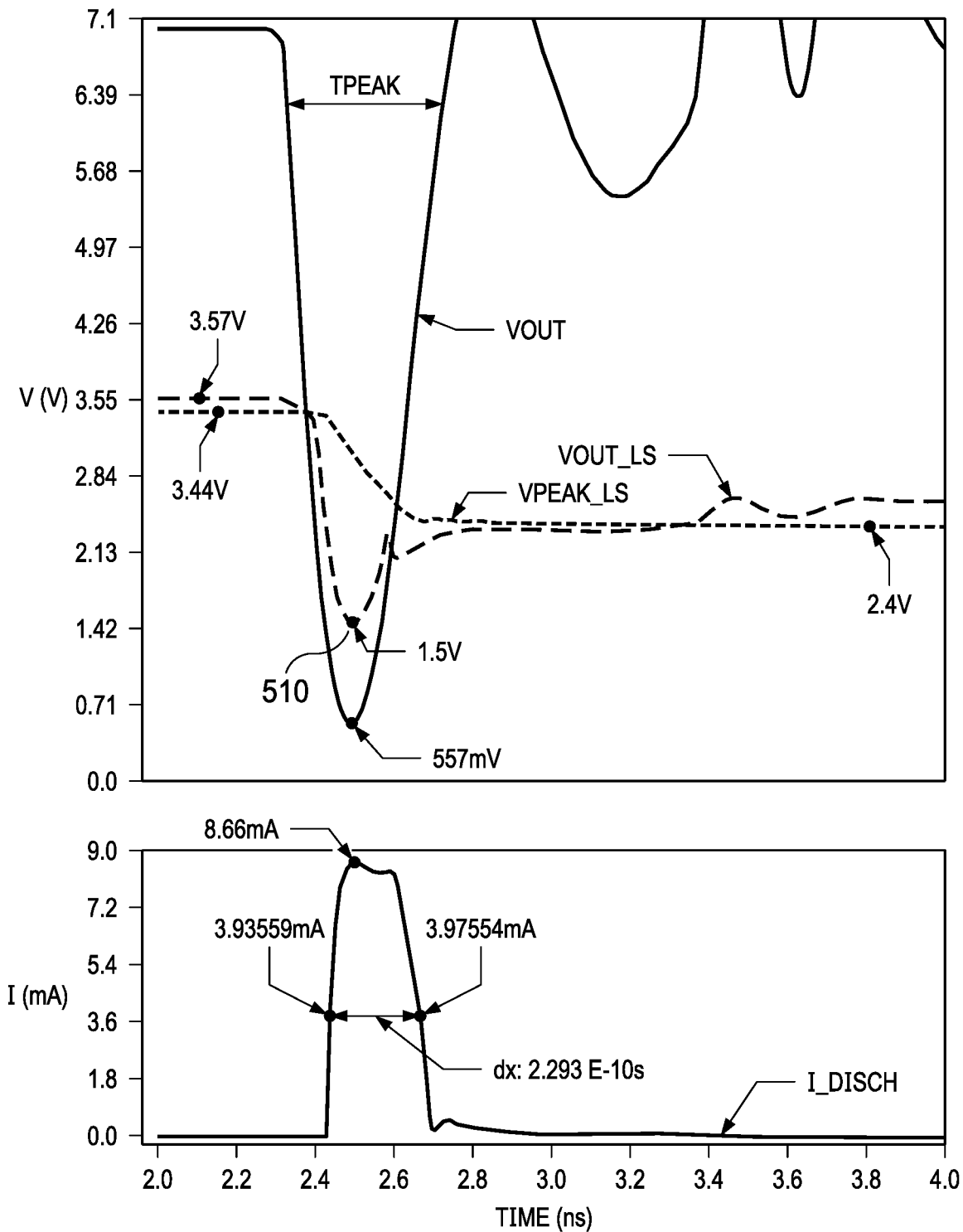
FIGS. 5 and 6 show example waveforms within the minimum peak detector as a laser diode is repeatedly turned on and off.

FIG. 5 shows what happens during the first pulse on VOUT when diode D0 turns on for the first time and VOUTmin is less than VCLmax minus the voltage drop across D0. For the narrow time duration in which VOUT_LS is substantially less than VPEAK_LS (approximately 230 ps in the example of FIG. 5) a large pump current through QP4 is present which is mirrored by QN1/QN0 to the capacitor Cpk. Cpk functions as a sampling capacitor. The current to the sampling capacitor Cpk is I_DISCH and causes VPEAK_LS to drop quickly during Tpeak. The current in QP4 during this short pulse has two components: a) the DC current component provided by ISRC3, which for power reasons is reasonably small (e.g., approximately 40 uA); and b) a transient component which is determined by C0, R1, the emitter area of QP4, and the initial voltage at VED (node 221). The transient component dominates the I_DISCH current during the first few pulses of VOUT and becomes progressively smaller as VPEAK_LS approaches the minimum value of VOUT_LS (510).

Resistor R1 limits the current in QP4 during the first pulse, when VOUTmin is close to ground. After the minimum peak detector circuit 130 reaches steady state (VPEAK_LS has reached its lowest value), $$ICH*(Ton+Toff)=I\_DISCH*Tpeak. \quad (1)$$

That is, I_DISCH (during Tpeak) integrated over the period of the signal (Ton+Toff) will equal the constant pull-up current ICH. During this steady state condition, VOUT_LS during Tpeak drops approximately 250 mV (27 degrees Celsius) bellow VPEAK_LS for Eq. (1) to hold true.

Figure 6:
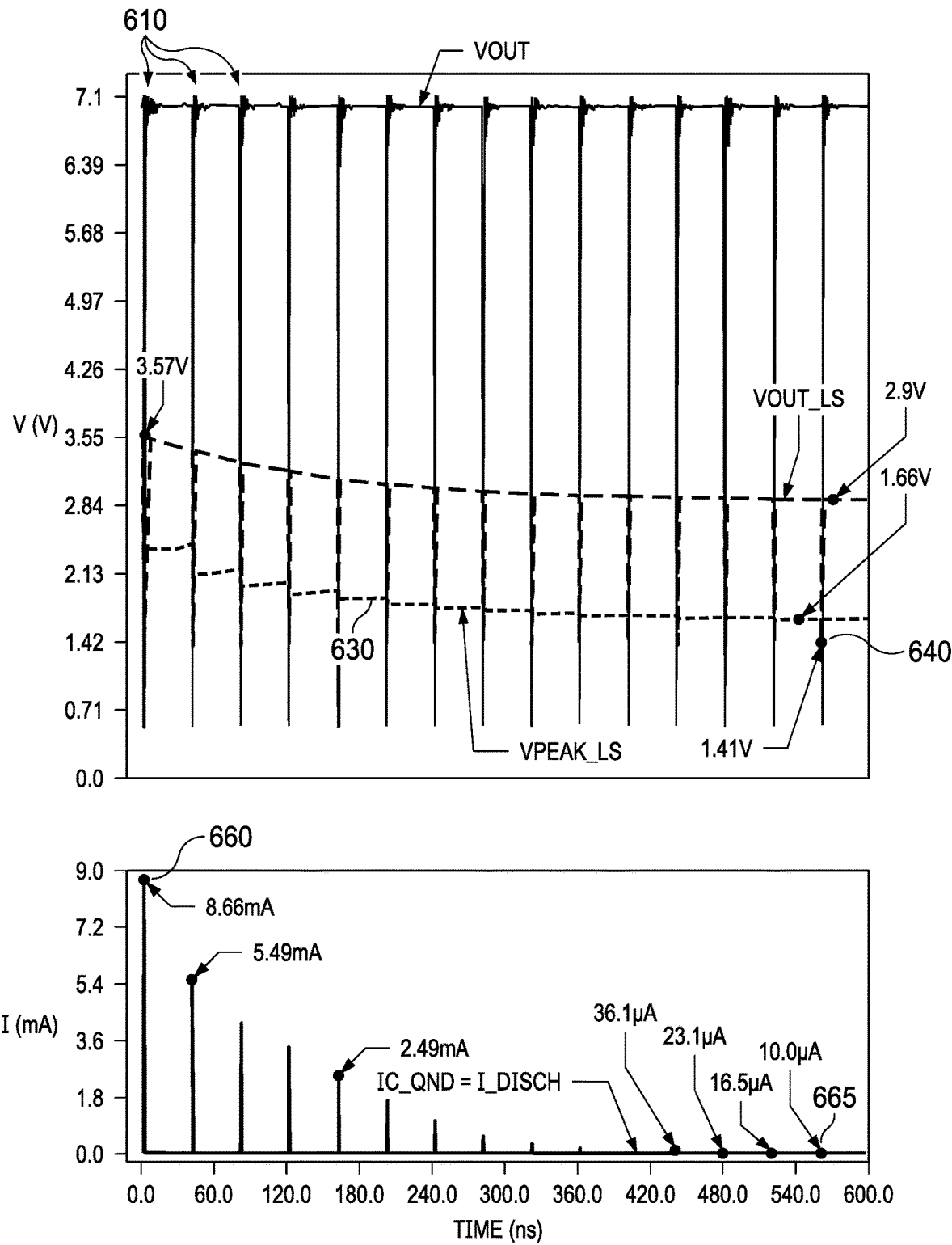

FIG. 6 shows multiple events 610 in which the laser diode 110 is turned on, each time with VOUT dropping (due to the inductance L0) to approximately 557 mV (VOUTmin). VOUT_LS also drops each time the laser diode 110 turns on. VOUT_LS drops to a level that is about one diode voltage drop higher than VOUTmin. During the progression of events 610 in which the laser diode 110 is repeatedly turned on, VPEAK_LS also begins to trend downward as shown at 630. VPEAK_LS flattens out at approximately 250 mV higher than minimum level 640 of VPEAK_LS. The 250 mV offset results from maintaining a sufficient voltage across the capacitor Cpk to be able to charge and discharge the capacitor. FIG. 6 also shows the progression of I_DISCH each time the laser diode 110 is turned on. Initially, I_DISCH is equal to 8.66 mA (as shown at 660) but falls to 10 µamps at 665.

Figure 7:
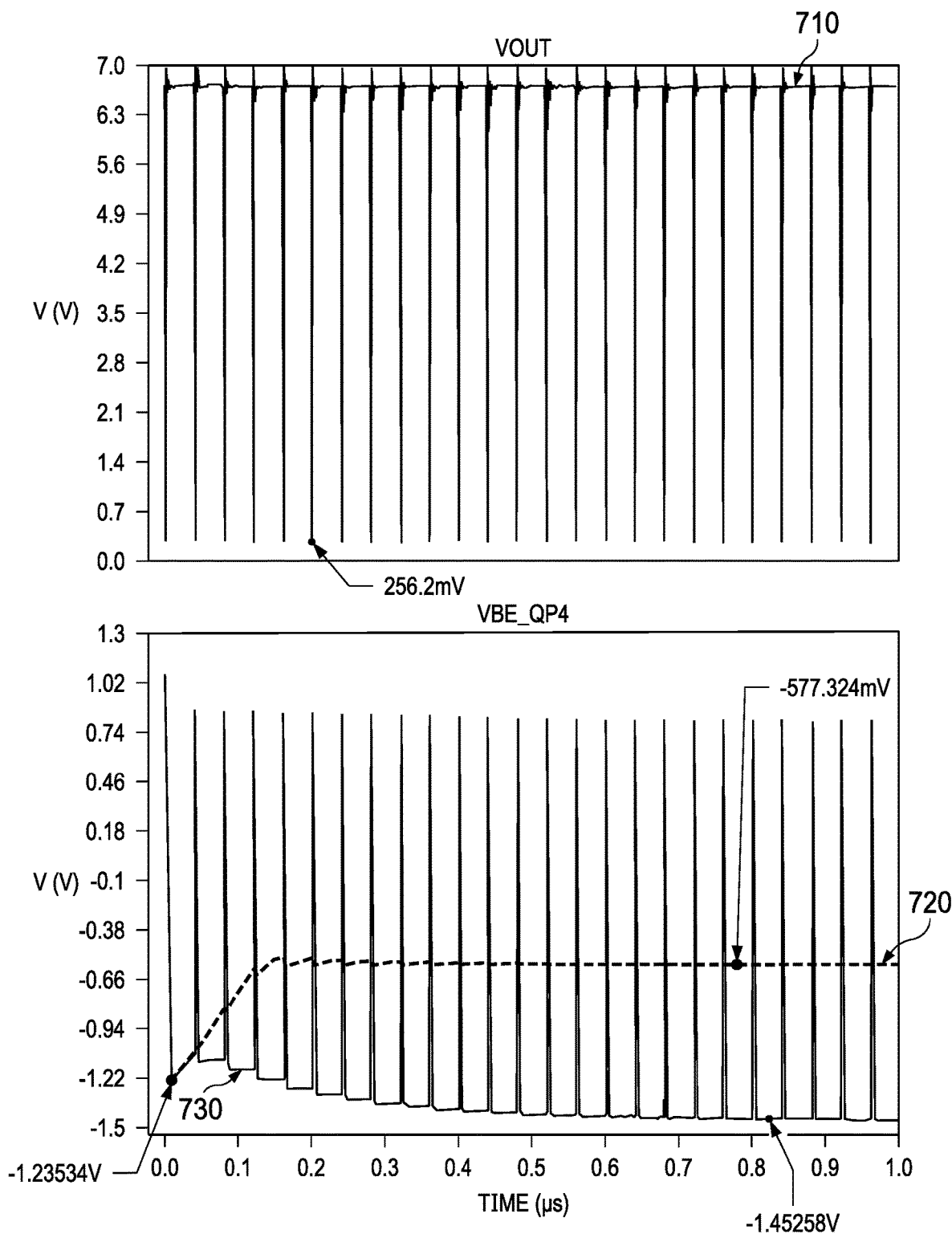
FIGS. 7 and 8 show example waveforms of the minimum peak detector for the dynamic clamp circuit of the peak detector being enabled and disabled.

FIG. 7 shows a comparison of several signals when the dynamic clamp circuit 210 is included and used versus not used. The upper waveform 710 shows an example of VOUT as the laser diode 110 is repeatedly turned on and off. In this example, VOUTmin is 256.2 mV. The lower waveforms of FIG. 7 show the base-to-emitter voltage (Vbe) of QP4 for the case in which the dynamic clamp circuit 210 is enabled (waveform 720) and the case in which the dynamic clamp circuit is disabled (waveform 730). For both cases the first peak on VOUT causes a maximum Vbe of approximately −1.23 V, which will not damage QP4. With the dynamic clamp circuit 210 disabled, Vbe reaches a steady state voltage of −1.45 V, which could damage QP4. With the dynamic clamp circuit enabled, Vbe reaches a steady state voltage of approximately −577 mV, which is not large enough to damage QP4. The Vbe of QP4 is the difference between VOUT_LS (base of QP4) and the voltage on QP4's emitter.

Figure 8:
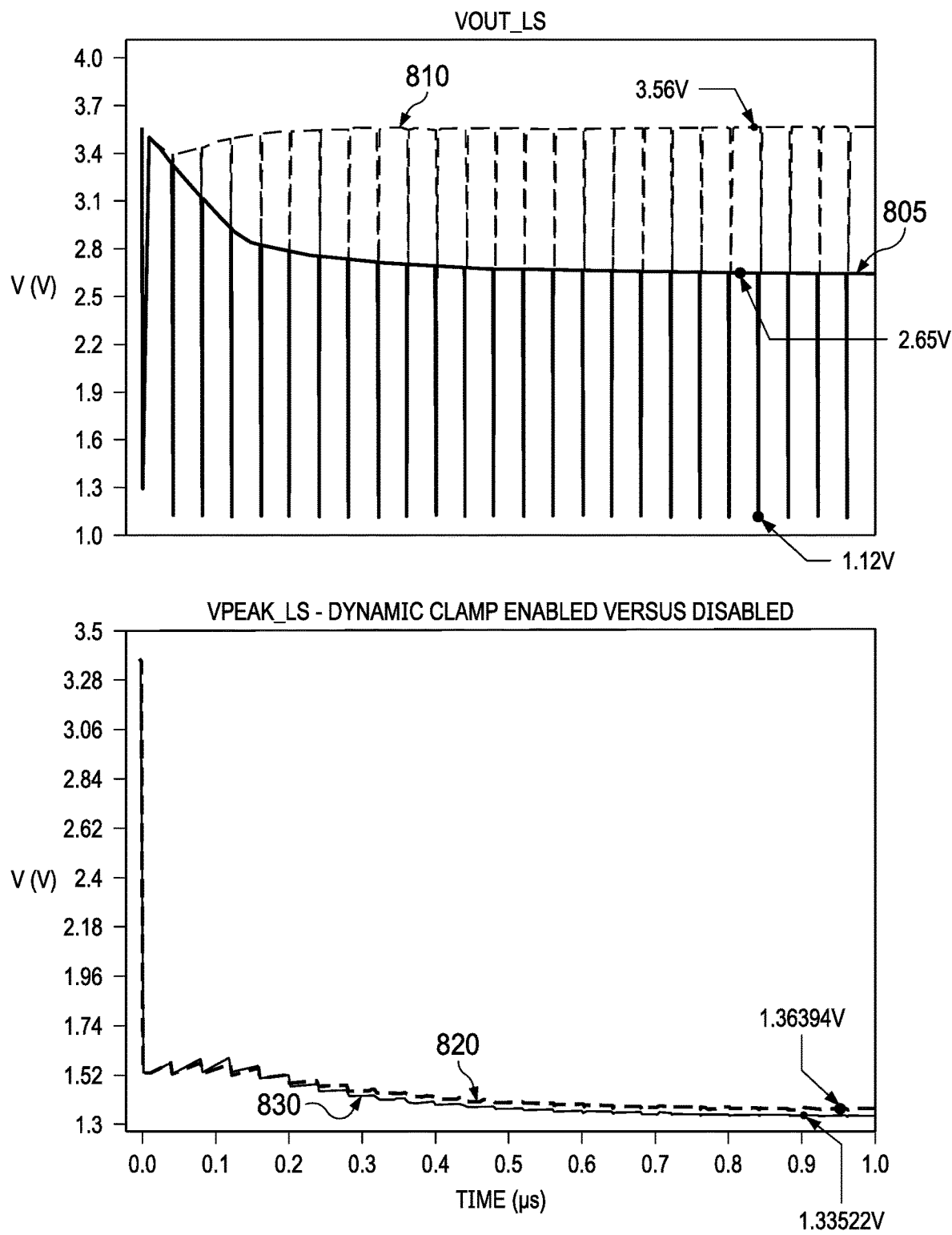

FIG. 8 shows the waveform 805 for VOUT_LS with the dynamic clamp circuit 210 enabled as the laser diode is repeatedly turned on and off. Waveform 810 shows VOUT_LS with the dynamic clamp circuit 210 disabled. With the dynamic clamp circuit 210 enabled, the maximum VOUT_LS voltage trends downward as shown to approximately 2.65 V in this example, thereby reducing QP4's Vbe. With the dynamic clamp circuit 210 disabled, VOUT_LS remains at VCLmax on node 217 (FIG. 2), which in this example is 3.56 V. The dynamic clamp circuit 210, when enabled, adjusts downward the maximum voltage at VOUT_LS by 0.91 V (3.56 V down to 2.65 V) thereby preventing the degradation of QP4.

The bottom portion of FIG. 8 shows VPEAK_LS for the two scenarios (dynamic clamp circuit 210 enabled and disabled). Waveform 820 shows an example of VPEAK_LS with the dynamic clamp circuit disabled, and waveform 830 shows an example of VPEAK_LS with the dynamic clamp circuit enabled. VPEAK_LS is slightly lower (by approximately 30 mV in this example) because VOUT_LS drops less with the dynamic clamp circuit enabled (2.65V to 1.12V) than in the case in which the dynamic clamp circuit is enabled (3.56V to 1.12V). The smaller voltage swing results in a wider pulse, thus requiring less overdrive at the input of QP4/QP5 to generate the same integrated I_DISCH current.

Referring back to FIG. 2, two offsets are compensated for by the offset correction circuit 250. The voltage drop across D0 is compensated by D2 that has the same current density as D0 when D0 is on. The offset of approximately 250 mV, that VPEAK_LS is larger than VOUT_LS, is compensated in the feedback of op amp OP0 by using Roff and ISRC8 and ISRC9. In addition, a low-pass filter is created by capacitor Clp in parallel with Roff to filter out the small glitches on VPEAK_LS caused during pulsing.

Figure 9:
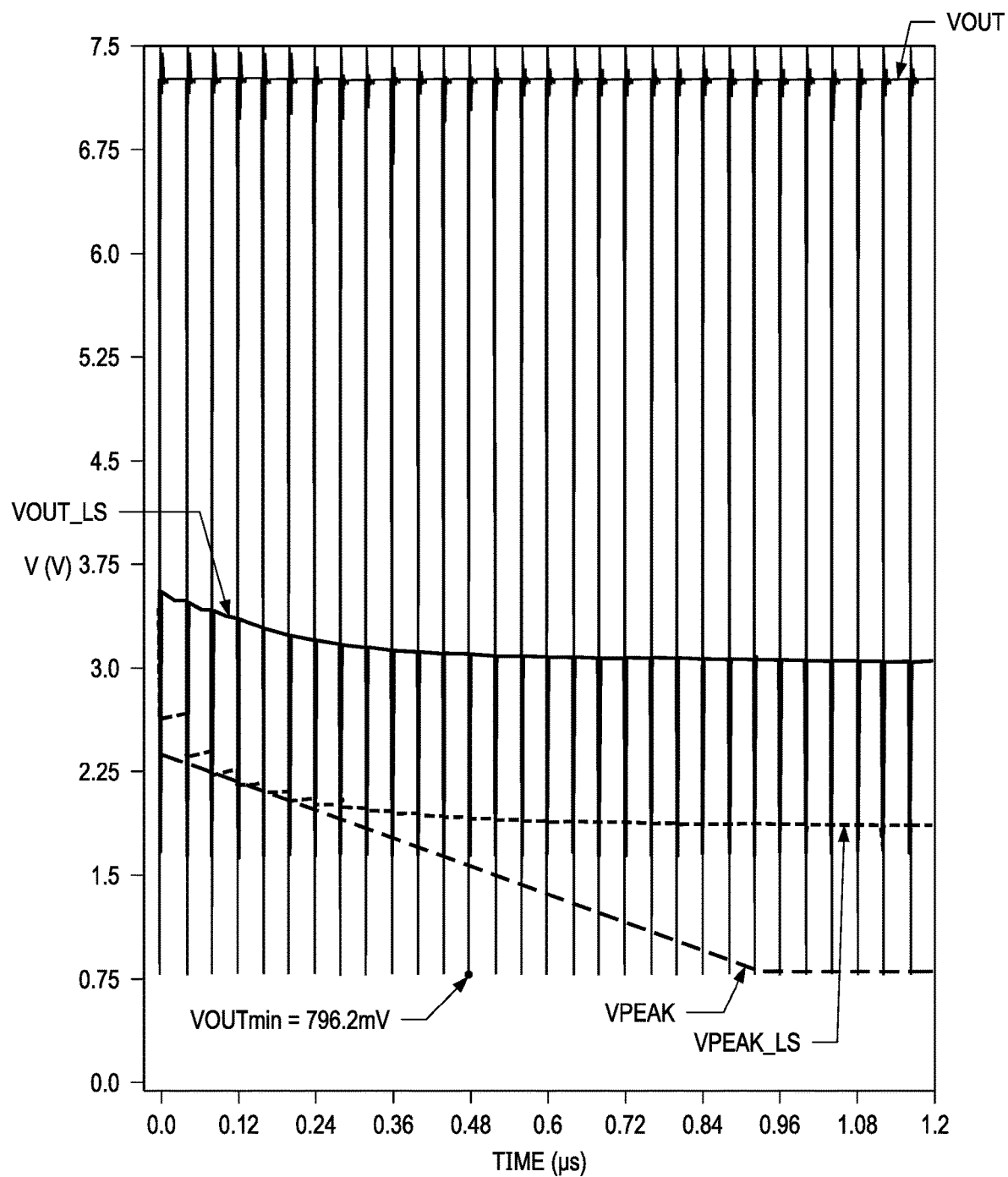
FIG. 9 illustrates the progression of the minimum peak detector's output signal towards the minimum peak of its input voltage over time as the laser diode is repeatedly turned on and off.

FIG. 9 shows example waveforms of VOUT, VOUT_LS, VPEAK_LS, and VPEAK, while the loop is acquiring VOUTmin, which in this example 796 mV. As shown, after the loop stabilizes, VPEAK settles at a level that is equal to VOUTmin. In this example, the loop took about 25 cycles (about 1 µsecs) to stabilize to produce an accurate level for VPEAK.

Figure 10:
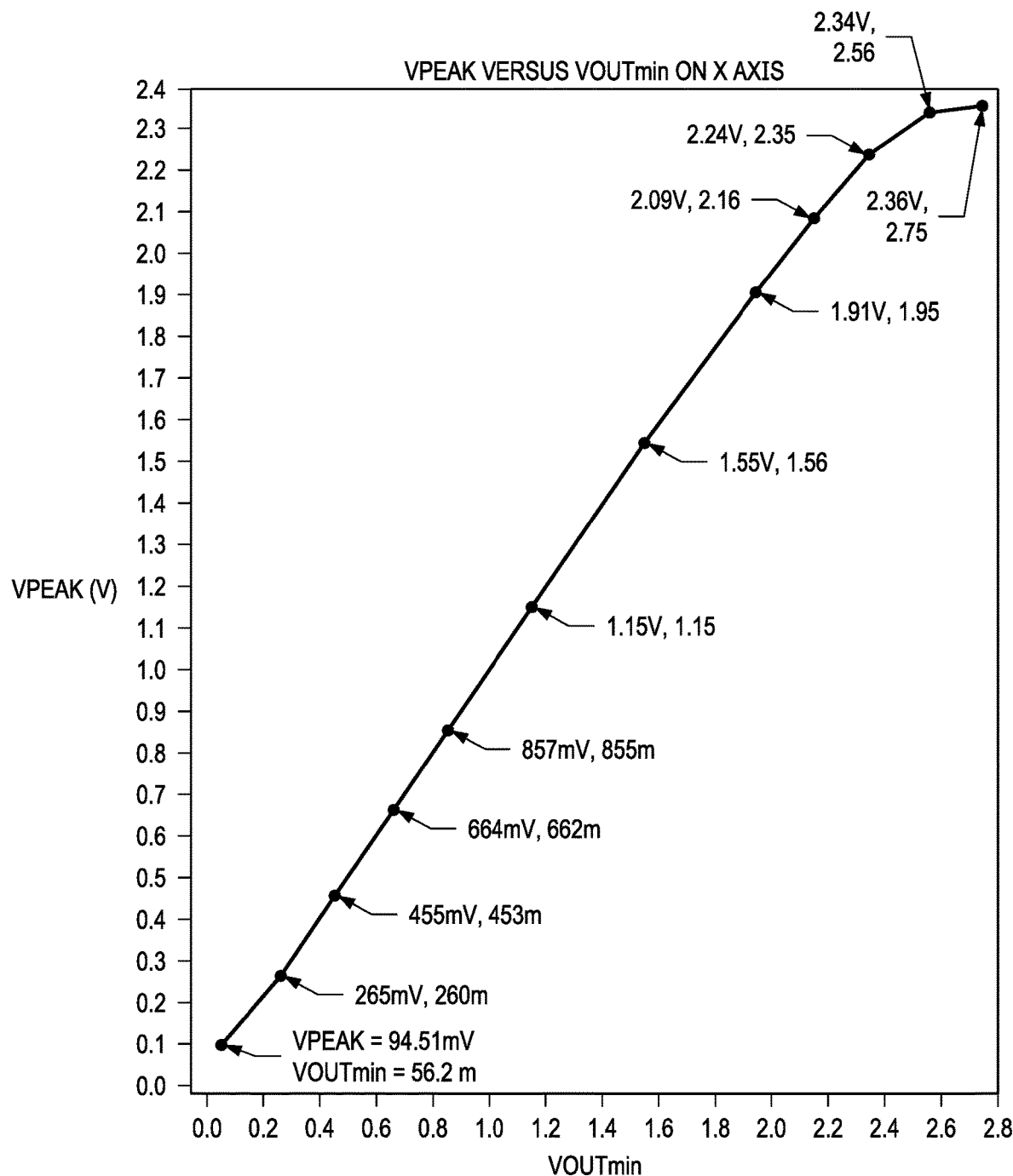
FIG. 10 illustrates the relatively relationship between the minimum peak detector's output signal versus its input voltage.

FIG. 10 shows an example relationship between VPEAK and VOUTmin with VOUTmin ranging from 50 mV to 2.75 V. The settled value of VPEAK is shown (settled after 1.4 µsecs). The graph of FIG. 10 shows satisfactory linearity for VOUTmin in the range of approximately 0.3 V to 2.3V. Some compression of VPEAK is present for VOUTmin greater than 2.3V due to lose of headroom at the VOUT_LS node 231. The compression issue can be improved if a larger voltage for supply VSUP is used.

Referring to FIG. 2, current ICH has a complementary to absolute temperature (CTAT) characteristic which helps the main peak detector circuit 220 maintain approximately the same minimum VOUT peak detection as temperature varies over a range of, for example, −20 degrees C. to 105 degrees C. Current ICH is the current from ISRC0 less the current from current source ISRC1. The current from ISRC0 is ICH_0TC and is a temperature-independent trimmed current. The current from ISRC2 is proportional to absolute temperature (PTAT) current. The subtraction of the two, results in a CTAT characteristic for ICH. The reason for the relatively constant level of VPEAK over temperature is that as temperature rises, QP4 slows down (e.g., lower bandwidth) and with that it conducts less pump current for the same VOUT_LS−VPEAK_LS voltage during time Tpeak. If ICH had a PTAT characteristic, as temperature increases, the peak detector loop would cause VPEAK_LS to increase so that it has more overdrive during Tpeak to compensate for ICH. By decreasing ICH as the temperature increases (CTAT), the peak detector loop can maintain about the same VPEAK voltage.

Figure 11:
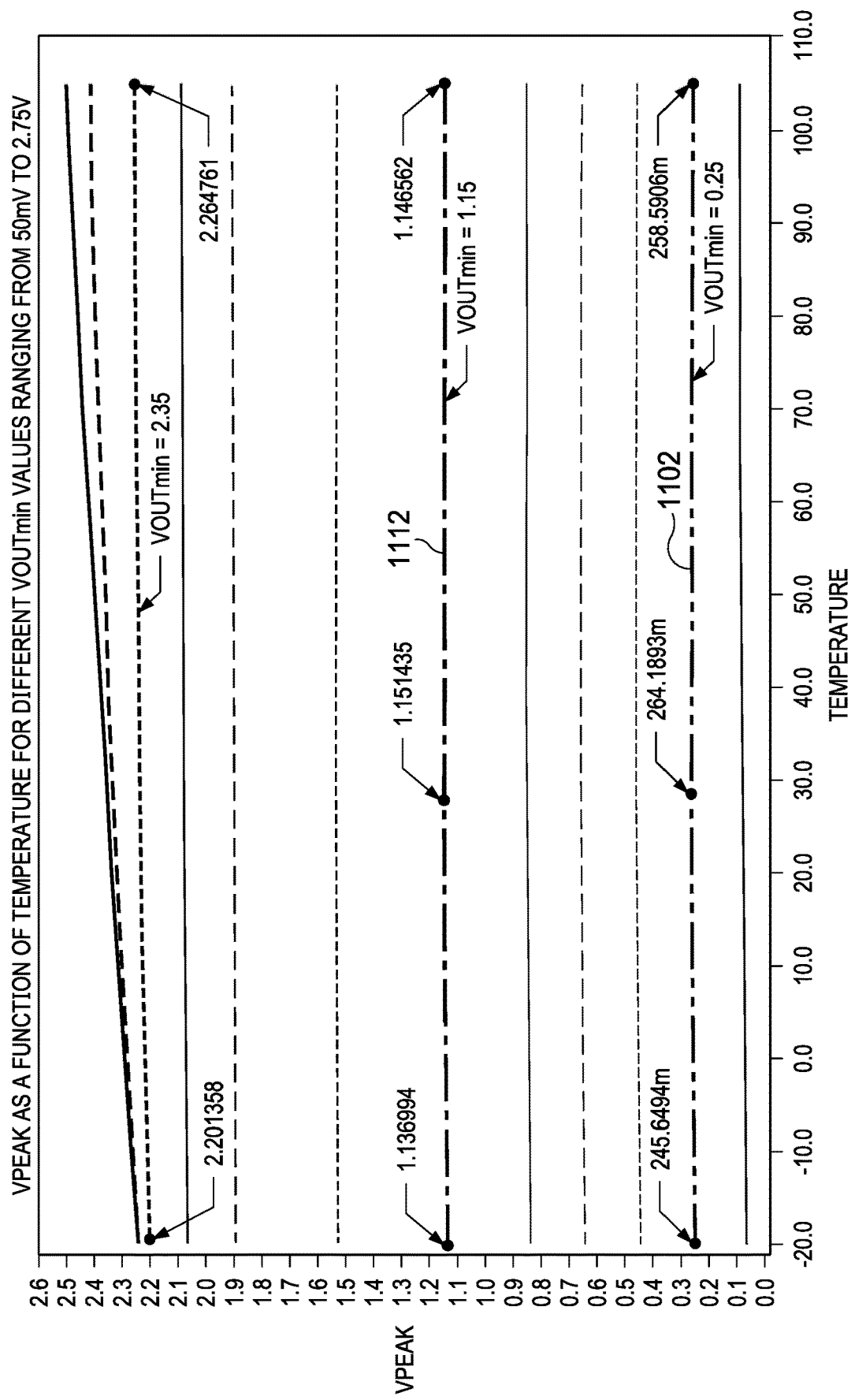
FIG. 11 illustrates that the example minimum peak detector disclosed herein is relatively temperature-independent.

FIG. 11 illustrates VPEAK for different VOUTmin values and for different temperatures. For example, plot 1102 shows VPEAK for a VOUTmin of 0.25 V for temperatures ranging from −20 degrees C. to 110 degrees C. Example plot 1112 shows VPEAK for a VOUTmin of 1.15 V across the same temperature range. For the range of VOUTmin of 250 mV to 2.3 V, the worst percentage variation is at VOUTmin=250 mV, where VPEAK varies by 19 mV for the detected VOUTmin peak of 250 mV, which is less than 8%.

Transistors comprise a control input and current terminals. In the case of a bipolar junction transistor, the control input is the base, and the current terminals are the emitter and collector. In the case of a metal oxide semiconductor field effect transistor, the control input is the gate, and the current terminals are the source and drain.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit, comprising:
    a peak detector circuit including a peak detector input and a peak detector output, the peak detector circuit configured to provide a voltage on the peak detector output proportional to a lowest voltage on the peak detector input;
    a diode including a cathode and an anode, the anode coupled to the peak detector input;
    a dynamic clamp circuit coupled to the peak detector input, the dynamic clamp circuit configured to clamp a voltage on the peak detector input responsive to a voltage on the anode being greater than the lowest voltage on the peak detector input; and
    an offset correction circuit coupled to the peak detector output, the offset correction circuit configured to provide an output signal whose amplitude is offset from an amplitude of the peak detector output.

2. The circuit of claim 1, wherein the peak detector circuit includes:
    a capacitor;
    a first transistor having a first control input coupled to the capacitor;
    a second transistor having a second control input coupled to the anode; and
    a third transistor coupled to the first control input and the capacitor.

3. The circuit of claim 2, wherein the peak detector circuit further includes a current source, a first resistor coupled between the current source and the first transistor, and a second resistor coupled between the current source and the second transistor.

4. The circuit of claim 1, wherein the diode comprises a bipolar junction transistor.

5. The circuit of claim 1, wherein the dynamic clamp circuit comprises:
    a PNP transistor having a base, a collector, and an emitter, and the base is coupled to the collector;
    a resistor coupled to the collector of the PNP transistor; and
    a first current source coupled between the resistor and a ground terminal.

6. The circuit of claim 5, wherein the diode is a first diode, and wherein the dynamic clamp circuit further comprises:
    a second current source coupled to the anode of the first diode;
    a second transistor; and
    a second diode coupled between the second current source and the second transistor.

7. The circuit of claim 5, further comprising:
    a second current source;
    a second diode having a cathode, and having an anode coupled to the anode of the first diode; and
    a second transistor coupled between the second diode and the ground terminal, the second transistor having a control input coupled to the peak detector output.

8. The circuit of claim 1, wherein the diode is a first diode, and the offset correction circuit includes:
    a second diode including a cathode and an anode; and
    an operational amplifier including an input coupled to the peak detector output and an output coupled to the anode of the second diode.

9. The circuit of claim 1, further comprising a current cancellation circuit including:
    a first transistor coupled to the peak detector output;
    a current source; and
    a second transistor coupled between the current source and the ground node, and having a control terminal coupled to a control terminal of the first transistor.

10. The circuit of claim 1, further comprising a charge current circuit comprising a first current source and a second current source, the first current source is coupled to the peak detector output, the second current source is coupled to the first current source, and the first current source comprises a proportional to absolute temperature (PTAT) current source.

11. A system, comprising:
    a laser diode; and
    a laser driver adapted to be coupled to the laser diode, the laser driver comprising:
        a peak detector circuit including a peak detector input and a peak detector output, the peak detector configured to provide a voltage on the peak detector output proportional to a lowest voltage on the peak detector input;
        a diode including a cathode and an anode, the anode coupled to the peak detector input;
        a dynamic clamp circuit coupled to the peak detector input, the dynamic clamp circuit configured to clamp a voltage on the peak detector input responsive to a voltage on the anode being greater than the lowest voltage on the peak detector input; and
        an offset correction circuit coupled to the peak detector output, the offset correction circuit configured to provide an output signal whose amplitude is offset from an amplitude of the peak detector output.

12. The system of claim 11, wherein the peak detector circuit includes:
    a capacitor;
    a first transistor having a first control input coupled to the capacitor;
    a second transistor having a second control input coupled to the anode;
    a third transistor coupled to the first control input and the capacitor;
    a current source;
    a first resistor coupled between the current source and the first transistor; and
    a second resistor coupled between the current source and the second transistor.

13. The system of claim 11, wherein the diode is a first diode and the dynamic clamp circuit comprises:
    a first transistor having a base, a collector, and an emitter, and the base is coupled to the collector;
    a resistor coupled to the collector of the first transistor;
    a first current source coupled between the resistor and a ground terminal;
    a second current source coupled to the anode of the first diode;

a second transistor; and a second diode coupled between the second current source and the second transistor.

14. The system of claim 11, further comprising a charge current circuit comprising a first current source and a second current source, the first current source is coupled to the peak detector output, the second current source is coupled to the first current source, and the first current source comprises a proportional to absolute temperature (PTAT) current source.

* * * * *